(12) United States Patent
Berdan et al.

(10) Patent No.: US 11,150,873 B2
(45) Date of Patent: Oct. 19, 2021

(54) ARITHMETIC APPARATUS

(71) Applicant: KABUSHIKI KAISHA TOSHIBA, Minato-ku (JP)

(72) Inventors: Radu Berdan, Shinagawa (JP); Yoshifumi Nishi, Yokohama (JP); Takao Marukame, Chuo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 79 days.

(21) Appl. No.: 16/801,252

(22) Filed: Feb. 26, 2020

(65) Prior Publication Data

US 2020/0379733 A1  Dec. 3, 2020

(30) Foreign Application Priority Data

May 30, 2019 (JP) .............................. JP2019-101692

(51) Int. Cl.
*G06F 7/523* (2006.01)
*G06F 7/556* (2006.01)
(Continued)

(52) U.S. Cl.
CPC .............. *G06F 7/523* (2013.01); *G06F 7/556* (2013.01); *G06F 17/16* (2013.01); *G11C 13/004* (2013.01);
(Continued)

(58) Field of Classification Search
CPC .......... G06F 5/523; G06F 7/556; G06F 17/16; G06F 7/5443; G06F 2207/4828;
(Continued)

(56) References Cited

U.S. PATENT DOCUMENTS 10,175,947 B1  1/2019 Marukame et al.
2018/0211154 A1  7/2018 Mori et al.
(Continued)

FOREIGN PATENT DOCUMENTS

JP  2019-053563 A  4/2019
JP  6556768 B2  8/2019
JP  2020-013398 A  1/2020

OTHER PUBLICATIONS

Prezioso et al., "Training and Operation of an Integrated Neuromorphic Network Based on Metal-Oxide Memristors", Nature vol. 521, Dec. 2014, 22 pages.

*Primary Examiner* — Tan V Mai
(74) *Attorney, Agent, or Firm* — Oblon, McClelland, Maier & Neustadt, L.L.P.

(57) ABSTRACT

An arithmetic apparatus according to an embodiment outputs a multiplicative value obtained by multiplying a weight value and an input value. The arithmetic apparatus includes a memristor, a logarithmic transform circuit, and a current-voltage converter circuit. The memristor is a device capable of changing voltage-current characteristic, and the memristor is preset to voltage-current characteristic according to the weight value. The logarithmic transform circuit applies an intermediate voltage, to the memristor, that is obtained by logarithmically transforming an input voltage according to the input value in accordance with a logarithmic transform function obtained by multiplying a natural logarithm function by a preset coefficient. The current-voltage converter circuit outputs an output voltage obtained by performing current-voltage conversion of current flowing through the memristor according to a preset linear function, as a multiplicative value.

14 Claims, 16 Drawing Sheets

(51) Int. Cl.
*G11C 13/00* (2006.01)
*G06F 17/16* (2006.01)

(52) U.S. Cl.
CPC ...... *G11C 13/0069* (2013.01); *G11C 2213/15* (2013.01)

(58) Field of Classification Search
CPC ..... G06F 2207/4802; G06F 2207/4824; G11C 2213/54; G11C 13/0007; G11C 11/54; G11C 2213/15
USPC .......................................................... 708/190
See application file for complete search history.

(56) References Cited

U.S. PATENT DOCUMENTS

| | | |
|---|---|---|
| 2020/0026496 A1 | 1/2020 | Marukame et al. |
| 2020/0303001 A1* | 9/2020 | Ogiwara ................. G11C 11/56 |
| 2021/0072957 A1* | 3/2021 | Eilert ...................... G06F 17/16 |

* cited by examiner

| PARAMETER | VALUE |
|---|---|
| b | 1.165 |
| s | 0.031 |
| $I_{READ\_1}$ [A] | 0.27 |
| $V_{max\_1}$ [V] | 3V |
| $I_S$ [A] | 7.2e-8 |
| n | 2.04 |
| $R_x$ [Ω] | 422k |
| $R_y$ [Ω] | 3.62 |
| H [V/V] | 16.3 |

ARITHMETIC APPARATUS

CROSS-REFERENCE TO RELATED APPLICATIONS

This application is based upon and claims the benefit of priority from Japanese Patent Application No. 2019-101692, filed on May 30, 2019; the entire contents of which are incorporated herein by reference.

FIELD

Embodiments described herein relate generally to an arithmetic apparatus.

BACKGROUND

A variable resistive device called a memristor is known. The memristor is capable of outputting a current flow proportional to the value obtained by multiplying the conductance by the input voltage when an input voltage equivalent to the input value is applied. The memristor therefore functions as a multiplier included in an analog arithmetic apparatus.

The memristor can lower the conductance. The analog arithmetic apparatus using a memristor as a multiplier can therefore apply an extremely small input voltage to the memristor. The analog arithmetic apparatus using the memristor as the multiplier can therefore perform arithmetic operation at very low power consumption.

In recent years, neural networks that are realized by hardware have been proposed. The neural network has a large number of multiply-accumulate units. Neural networks realized by hardware can therefore perform arithmetic operations at low power consumption by including analog multiply-accumulate units utilizing the memristor as a multiplier.

The memristor is a tunneling device. As such, the memristor has a non-linear voltage-current characteristic. In other words, for the memristor, the conductance varies depending on the applied voltage during multiplication. Therefore, analog arithmetic apparatuses using memristors as multipliers have large errors in output values.

DETAILED DESCRIPTION

An arithmetic apparatus according to an embodiment outputs a multiplicative value obtained by multiplying a weight value and an input value. The arithmetic apparatus includes a memristor, a logarithmic transform circuit, and a current-voltage converter circuit. The memristor is a device capable of changing voltage-current characteristic, and the memristor is preset to voltage-current characteristic according to the weight value. The logarithmic transform circuit applies an intermediate voltage, to the memristor, that is obtained by logarithmically transforming an input voltage according to the input value in accordance with a logarithmic transform function obtained by multiplying a natural logarithm function by a preset coefficient. The current-voltage converter circuit outputs an output voltage obtained by performing current-voltage conversion of current flowing through the memristor according to a preset linear function, as a multiplicative value. Each of the following described embodiments performs accurate analog arithmetic operation at low power consumption using a memristor 20 as an analog multiplier. For example, in a first embodiment, multiplication is performed using the memristor 20. In a second embodiment, multiply-accumulate operation processing is performed using a plurality of memristors 20. In a third embodiment, matrix arithmetic operation processing is performed using the memristors 20. The unique features of the memristor 20 that are perceived by the inventor are described along with the explanation of each embodiment.

Preconditions

Figure 1:
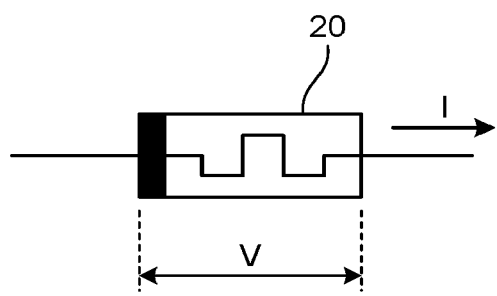
FIG. 1 is a diagram illustrating a memristor.

FIG. 1 is a diagram illustrating the memristor 20. The memristor 20 can change the voltage-current characteristics (I-V curve), and is a variable resistor device capable of retaining (storing) the voltage-current characteristics.

The memristor 20 is a tunneling device that passes electrical charges or positive holes by way of a tunneling effect. In the present embodiment, the memristor 20 is a ferroelectric tunnel junction device (FTJ device) having material including ferroelectrics as tunnel insulator film. The ferroelectric substance is for example hafnium dioxide. The memristor 20 is not limited to an FTJ device and may be a tunneling device that is fabricated from other materials.

The memristor 20 can store conductance (resistance value) by non-volatile storage when a specified voltage is applied. The memristor 20 has a self-rectifying function. In other words, the memristor 20 flows electrical current in the forward current direction when a voltage is applied in the forward direction from an input terminal to an output terminal and does not flow current in the reverse direction when a voltage is applied in the reverse direction.

Figure 2:
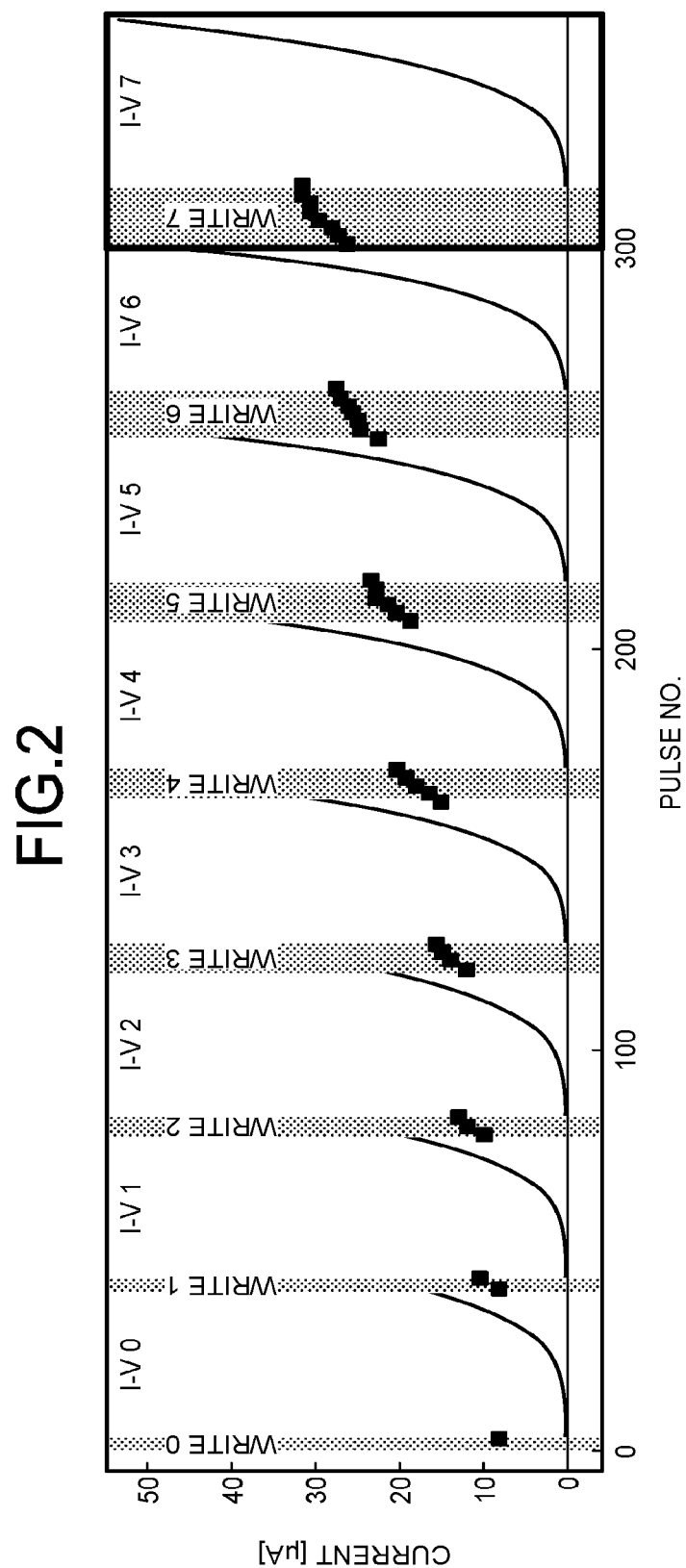
FIG. 2 is a diagram illustrating current that flows in a ferroelectric tunnel junction (FTJ) device.
Figure 3A:
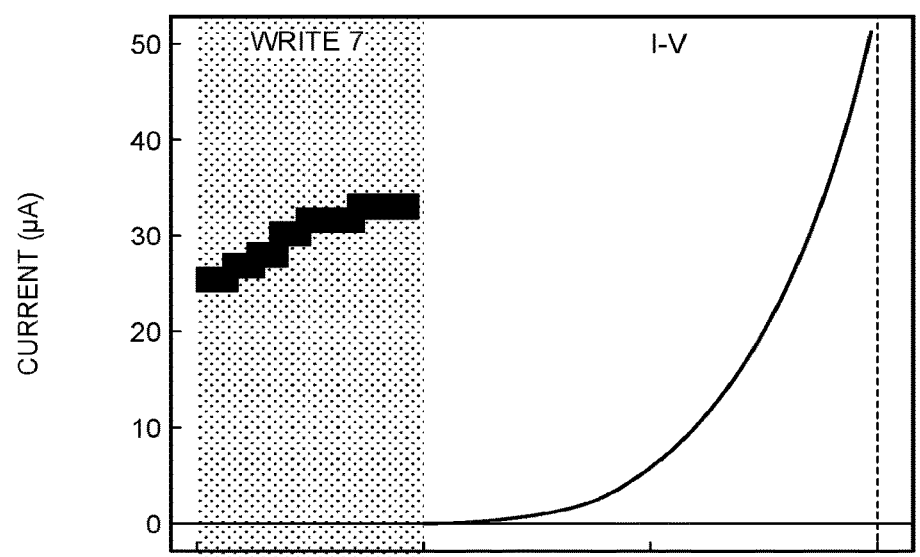
FIG. 3A is a graph of an enlarged view of FIG. 2
Figure 3B:
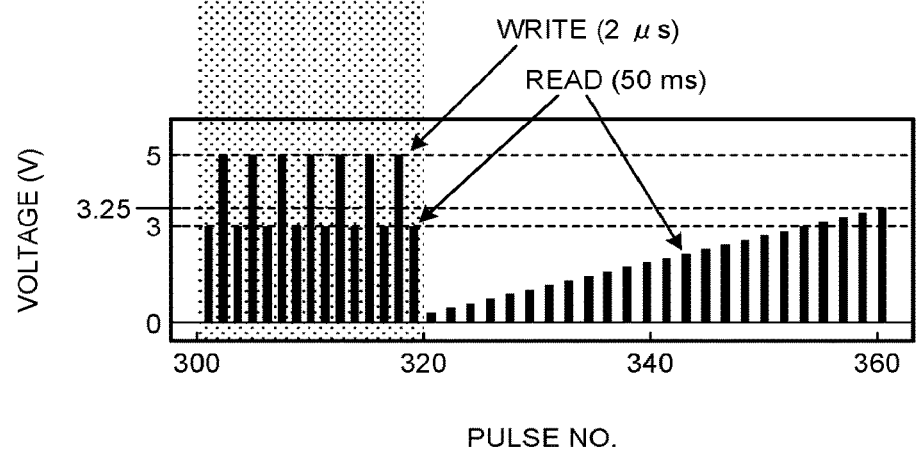
FIG. 3B is a graph illustrating a write pulse and a read pulse.

FIG. 2 is a diagram illustrating current that flows in the memristor 20 during alternate repetitions of the write periods (WRITE 0 to WRITE 7) for varying the conductance, and the read periods (I-V0 to I-V7) for measuring the voltage-current characteristics. FIG. 3A is a graph of an enlarged view of the seventh write period and read period in FIG. 2. FIG. 3B is a graph of the write pulse voltage and the read pulse voltage in the seventh write period and the seventh read period in FIG. 2.

Each of write periods (WRITE 0 to WRITE 7) from the first time to the seventh time illustrates the current that flows in the FTJ device while applying read pulses when write pulses and read pulses are alternately applied to the FTJ device for a specified count. The FTJ device is one example of the memristor 20. The threshold voltage in this example is 3.25 volts. In this example, the write pulse is 5 volts higher than the threshold voltage and the pulse time width is 2 microseconds. The read pulse that is applied during the write period is 3 volts lower than the threshold voltage and the pulse time width is 50 milliseconds.

Each of the read periods (I-V0 to I-V7) from the first time to the seventh time illustrates the current flow in the FTJ device when a plurality of read pulses linearly increasing from 0 volts is applied in the FTJ device. Each of the read pulses that are applied in the read periods has a pulse time width of 50 milliseconds. All of the read pulses that are applied in the read period are lower than the threshold voltage.

As illustrated in the read periods (I-V0 to I-V7) from the first time to the seventh time, the voltage-current characteristics of the memristor 20 are non-linear when a voltage is applied in a read voltage range lower than the threshold voltage.

As illustrated in the respective write periods (WRITE0 to WRITE7) from the first time to the seventh time, the voltage-current characteristics of the memristor 20 change when a voltage equal to or higher than the threshold voltage is applied. Specifically, the voltage-current characteristics of the memristor 20 change in the direction that conductance becomes high according to the applied time width (charge quantity). The voltage-current characteristics of the memristor 20 do not change when the applied voltage is lower than the threshold voltage.

Figure 4:
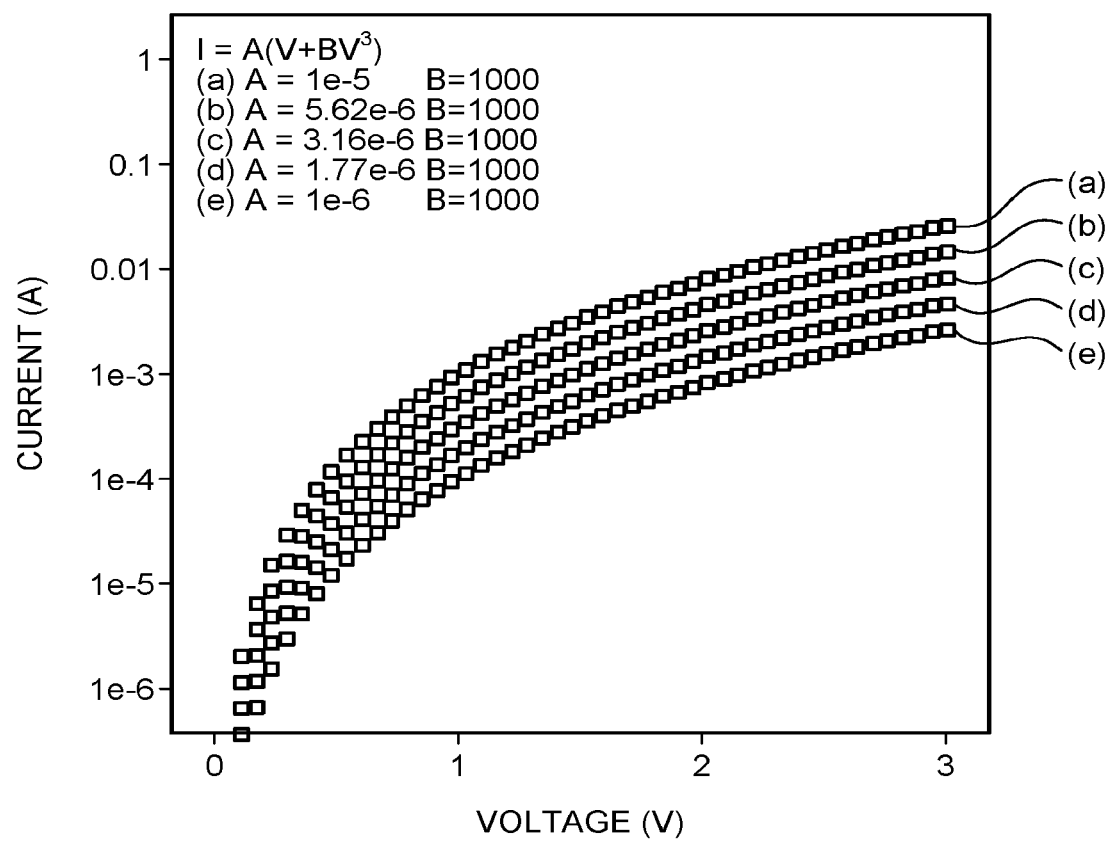
FIG. 4 is a graph illustrating the WKB approximation curve.

FIG. 4 is a graph illustrating the WKB approximation curve approximating the voltage-current characteristics of the memristor 20 in the voltage read range. In FIG. 4, the vertical axis expresses the current and the horizontal axis expresses the voltage. In FIG. 4, the vertical axis is a logarithmic scale.

The memristor 20 is the tunneling device. Therefore, when a voltage in the read voltage range (voltage lower than the threshold voltage) is applied, the voltage-current characteristics of the memristor 20 are expressed by formula (1) based on the Wentzel-Kramers-Brillouin approximation (WKB approximation).

$$I=A(V+BV^3) \quad (1)$$

Here, I denotes the current flow in the memristor 20. V denotes the voltage across the memristor 20.

Here, A denotes a constant dependent on the tunnel resistance layer in the memristor 20. A therefore varies according to the electrical charge quantity passing through the tunnel insulation layer.

B denotes the constant dependent on the device material in the memristor 20. B is therefore constant regardless of the electrical charge quantity passing through the tunnel insulation layer.

Here, (a) in FIG. 4 illustrates a WKB approximation curve for A=1e−5, B=1000. (b) in FIG. 4 illustrates a WKB approximation curve for A=5.62e−6, B=1000. (c) in FIG. 4 illustrates a WKB approximation curve for A=3.16e−6, B=1000. (d) in FIG. 4 illustrates a WKB approximation curve for A=1.77e−6, B=1000. (e) in FIG. 4 illustrates a WKB approximation curve for A=1e−6, B=1000.

Figure 5:
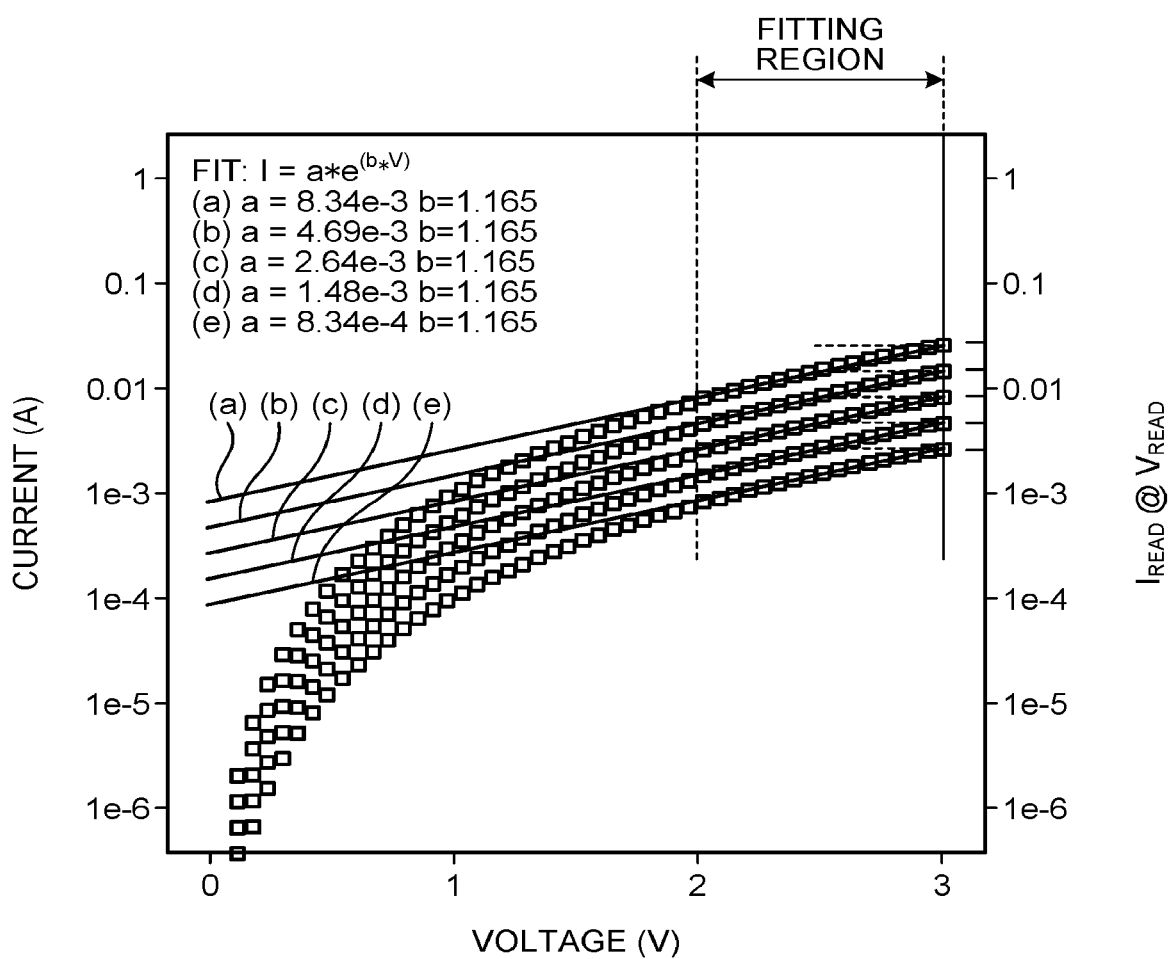
FIG. 5 is a graph illustrating the WKB approximation curve and the fitting curve.

FIG. 5 is a graph illustrating the WKB approximation curve and the fitting curve expressing the natural exponential function that fits the fitting region of the WKB approximation curve. In FIG. 5, the vertical axis expresses the current and the horizontal axis expresses the voltage. In FIG. 5 the vertical axis is a logarithmic scale.

Finding by the inventors is that that the voltage-current characteristics in the region on the high voltage side within the read voltage range of the memristor 20 can be fitted with extremely small error by the natural exponential function expressed in formula (2).

$$I=ae^{bV} \quad (2)$$

a and b denote the constant that is derived from the fitting. In this formula, a is called the conductance parameter and b is called the device parameter. e is the Euler number (Napier's constant).

Fitting is generally processing to find a function that expresses a curve. In the present embodiment, fitting is processing to find the natural exponential function including the conductance parameter a and the device parameter b with the smallest error relative to the voltage-current characteristics in the sub-region of the read voltage range of the memristor 20.

Further finding by the inventors is that in the WKB approximation curve, there is a sub-region where the device parameter b within the fitted natural exponential function becomes constant (variations are below a predetermined value) even if the constant (A) dependent on the tunnel insulation layer varies. In other words, finding by the inventors is such that there is a sub-region on the high voltage side of the read voltage range in the memristor 20 where the device parameter b within the fitted natural exponential function is constant regardless of changes in the state of the memristor 20 (changes in the voltage-current characteristics).

For example, (a) in FIG. 5 is a fitting curve expressing the natural exponential function that is fitted within the range of 2 volts to 3 volts on the WKB approximation curve for A=1e−5, B=1000. Here, (a) expresses the natural exponential function for a=8.34e−3, b=1.165.

(b) in FIG. 5 is a fitting curve expressing the natural exponential function that is fitted within the range of 2 volts to 3 volts on the WKB approximation curve for A=5.62e−6, B=1000. Here, (b) expresses the natural exponential function for a=4.69e−3, b=1.165.

(c) in FIG. 5 is a fitting curve expressing the natural exponential function that is fitted within the range of 2 volts to 3 volts on the WKB approximation curve for A=3.16e−6, B=1000. Here, (c) expresses the natural exponential function for a=2.64e−3, b=1.165.

In FIG. 5, (d) is a fitting curve expressing the natural exponential function that is fitted within the range of 2 volts to 3 volts on the WKB approximation curve for A=1.77e−6, B=1000. Here, (d) expresses the natural exponential function for a=1.48e−3, b=1.165.

In FIG. 5, (e) is a fitting curve expressing the natural exponential function that is fitted within the range of 2 volts to 3 volts on the WKB approximation curve for A=1e−6, B=1000. Here, (e) expresses the natural exponential function for a=8.34e−4, b=1.165.

In this way, for example in the five WKB approximation curves illustrated in FIG. 5, the device parameters b within the natural exponential function fitted within the range of 2 volts to 3 volts, are all within the same sub-region regardless of changes in the voltage-current characteristics (change in the state of the memristor 20).

The section of the region on the high voltage side within the read voltage range of the memristor 20 is therefore called the fitting region. Namely, among the voltage-current characteristics in the read voltage range for the memristor 20, the fitting region is a sub-region in which the device parameters b are constant within the fitted natural exponential function regardless of changes in the voltage-current characteristics (change in the state of the memristor 20). Here, $V_{READ}$ is an optional voltage within the fitting region. In the example in FIG. 5, $V_{READ}$ is 3 volts.

Figure 6:
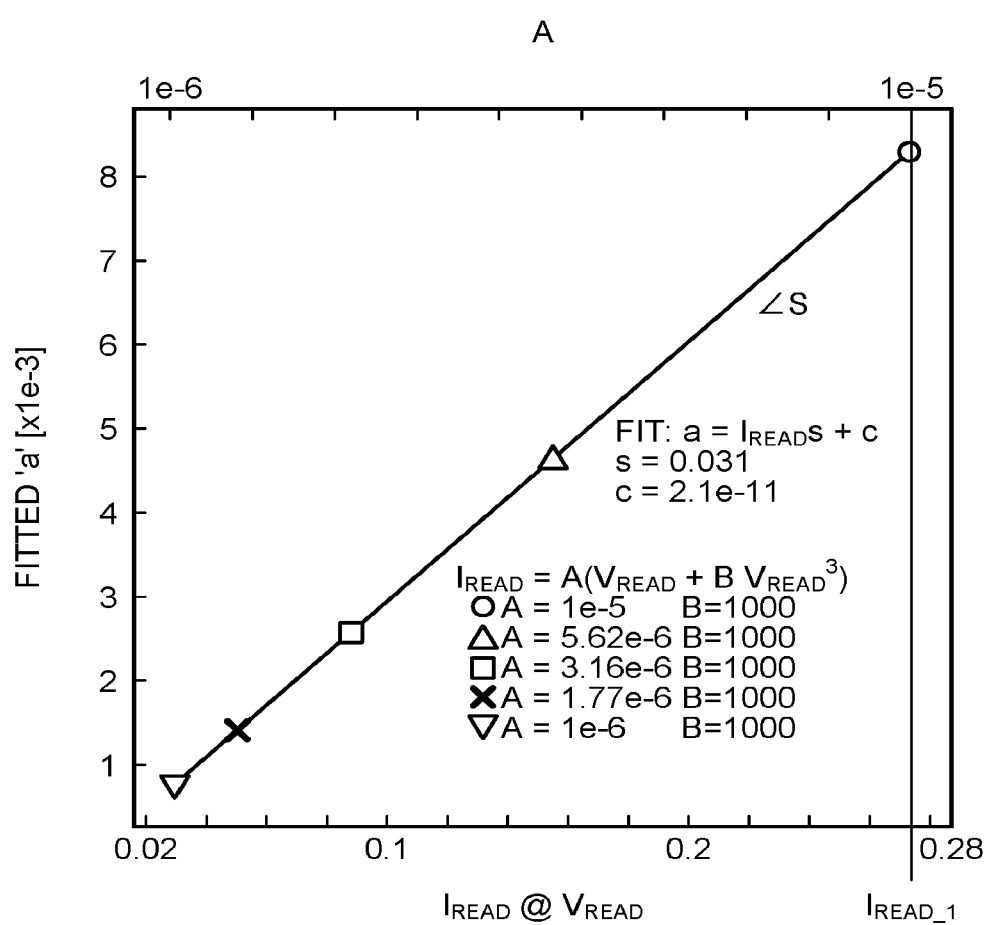
FIG. 6 is a graph illustrating a conductance parameter.

FIG. 6 is a graph illustrating the conductance parameter a for the current, when the voltage calculated based on the WKB approximation curve in FIG. 5 and applied to the memristor 20 is fixed at $V_{READ}$. As illustrated in FIG. 6, when the voltage applied to the memristor 20 is fixed, the conductance parameter a changes linearly relative to the current. The conductance parameter a changes according to the function expressed in formula (3).

$$a = I_{READ} \times s + c \quad (3)$$

Here, $I_{READ}$ is the current flowing in the memristor 20 when an optional voltage ($V_{READ}$) is applied within the fitting region. $I_{READ}$ is proportional to A on the WKB approximation curve. In other words, $I_{READ}$ changes according to the state of the memristor 20 (namely, the voltage-current characteristics set in the memristor 20). $I_{READ\_1}$ is the maximum current in the fitting region.

Here, s and c are constants. In the five WKB approximation curves illustrated in FIG. 5, s is 0.031 and c is 2.1e−11.

As illustrated above, the memristor 20 current can flow according to a value from multiplying a weight value by a input value when a voltage according to an input value is applied, by setting the state of the memristor 20 (voltage-current characteristics of the memristor 20) to attain a conductance parameter a according to the weight value.

Figure 7:
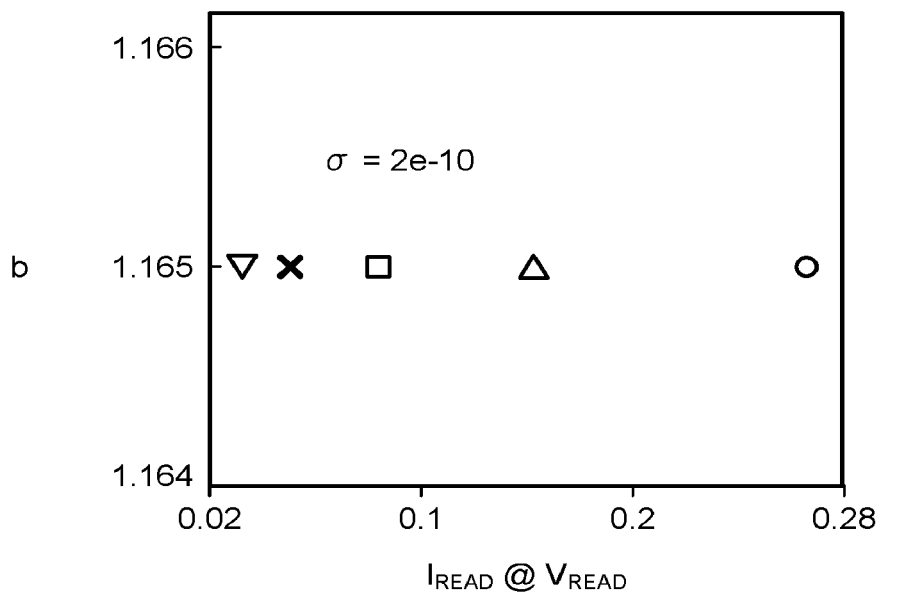
FIG. 7 is a graph illustrating device parameters.

FIG. 7 is a graph illustrating the device parameter b for the current, when the voltage calculated based on the WKB approximation curve in FIG. 5 and applied to the memristor 20 is fixed at $V_{READ}$. As illustrated in FIG. 7, the device parameter b is almost constant relative to the current when the voltage applied to the memristor 20 is fixed. In other words, the device parameter b is constant regardless of the state of the memristor 20 (namely, the voltage-current characteristics set in the memristor 20). In the five WKB approximation curves illustrated in FIG. 5, the σ (sigma) of the standard error for b is 2e−10. In other words, b is an extremely small variation and is almost constant.

As seen from the above description, by applying an input voltage corrected by an inverse function of the fitted natural exponential function as the voltage to the memristor 20, the memristor 20 is capable of current flow that is mostly linear relative to the input voltage.

Figure 8:
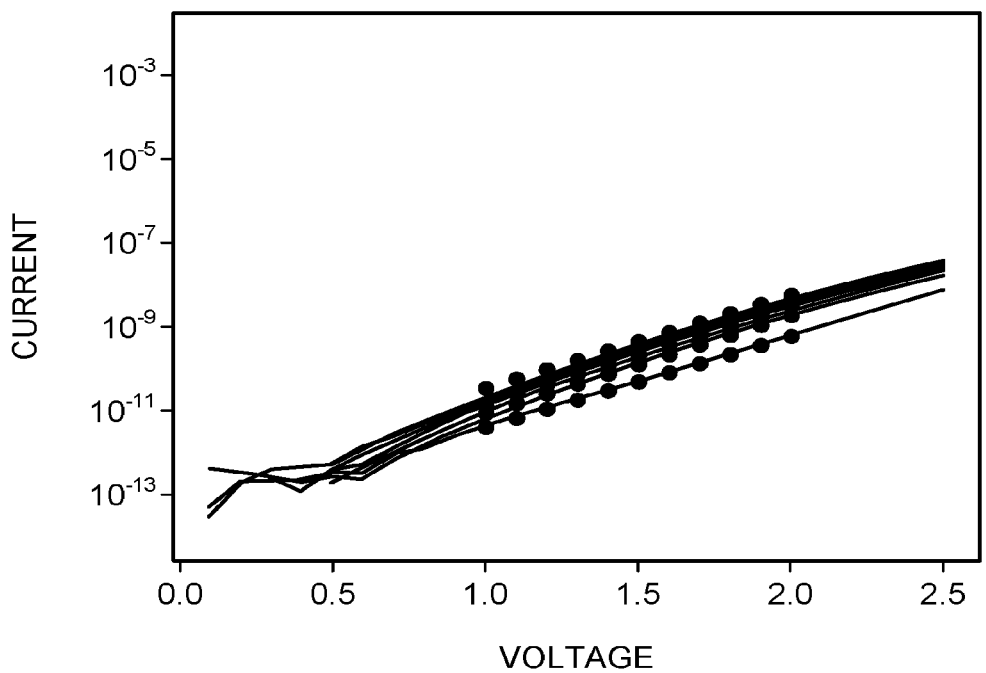
FIG. 8 is a graph illustrating the voltage-current characteristics of the actually measured FTJ device.
Figure 9:
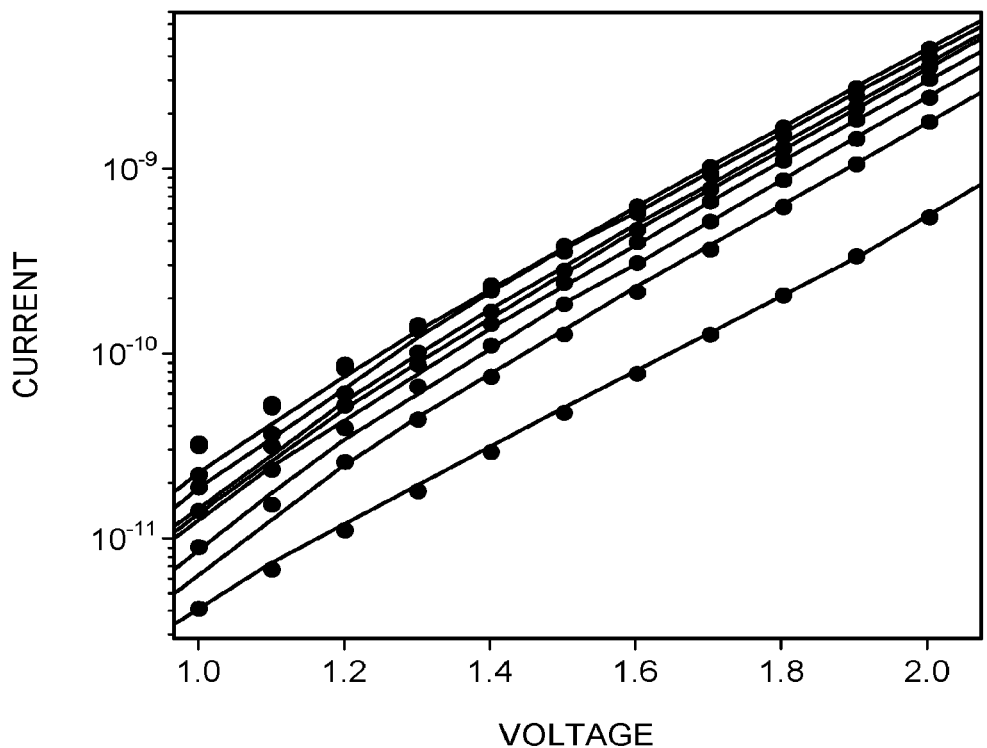
FIG. 9 is an enlarged fragmentary view of FIG. 8.

FIG. 8 is a graph illustrating the voltage-current characteristics that are actually measured on an FTJ device. FIG. 9 is an enlarged view of a fragment of FIG. 8. The measurement results illustrated in FIGS. 8 and 9 are obtained by measuring the voltage-current characteristics of the FTJ device serving as one example of the memristor 20.

Figure 10:
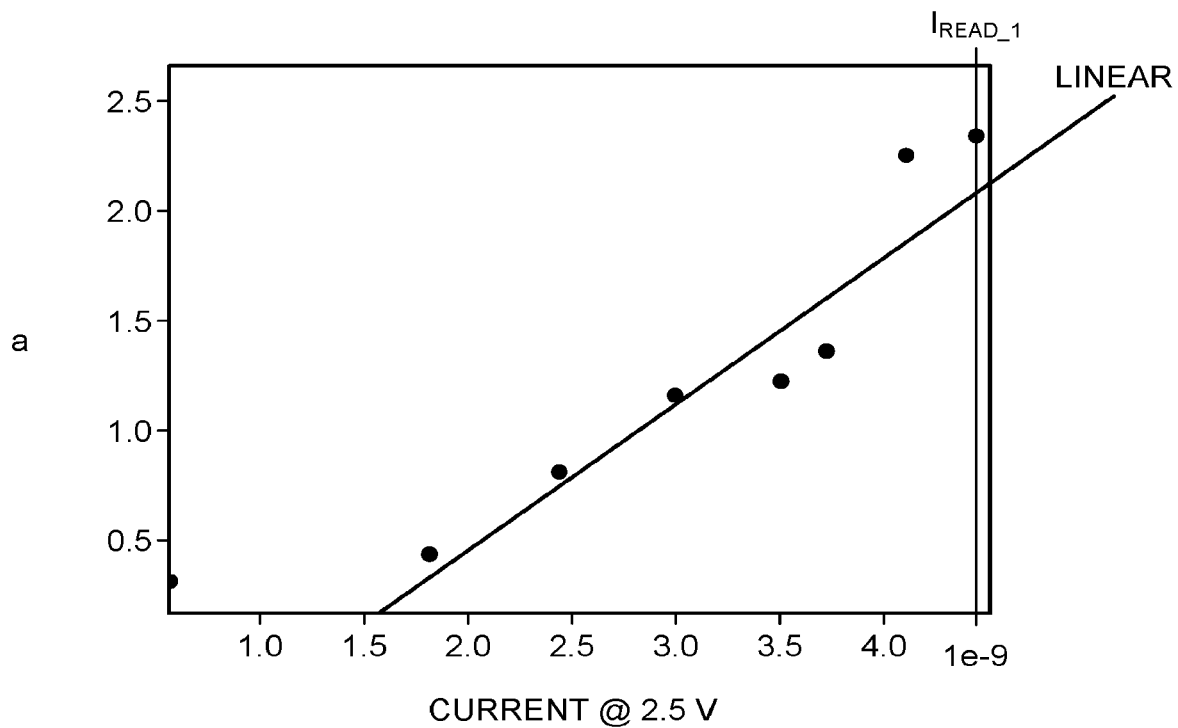
FIG. 10 is a graph illustrating the conductance parameter of the actually measured FTJ device.

FIG. 10 is a graph illustrating the conductance parameter a for the current flowing in the FTJ device, when the voltage calculated based on the voltage-current characteristics of the actually measured FTJ device is applied to the FTJ device at a voltage fixed at 2.5 volts. As illustrated in FIG. 10, the change in the conductance parameter a that is obtained by measuring the FTJ device is mostly linear relative to the current when the voltage applied to the FTJ device is fixed at $V_{READ}$ (2.5 volts). Therefore, by setting the state of the FTJ device (voltage-current characteristics of the FTJ device) so that the conductance parameter a changes according to a weight value, the current from the FTJ device can flow according to a value that is the input value multiplied by the weight value when a voltage corresponding to the input value is applied.

Figure 11:
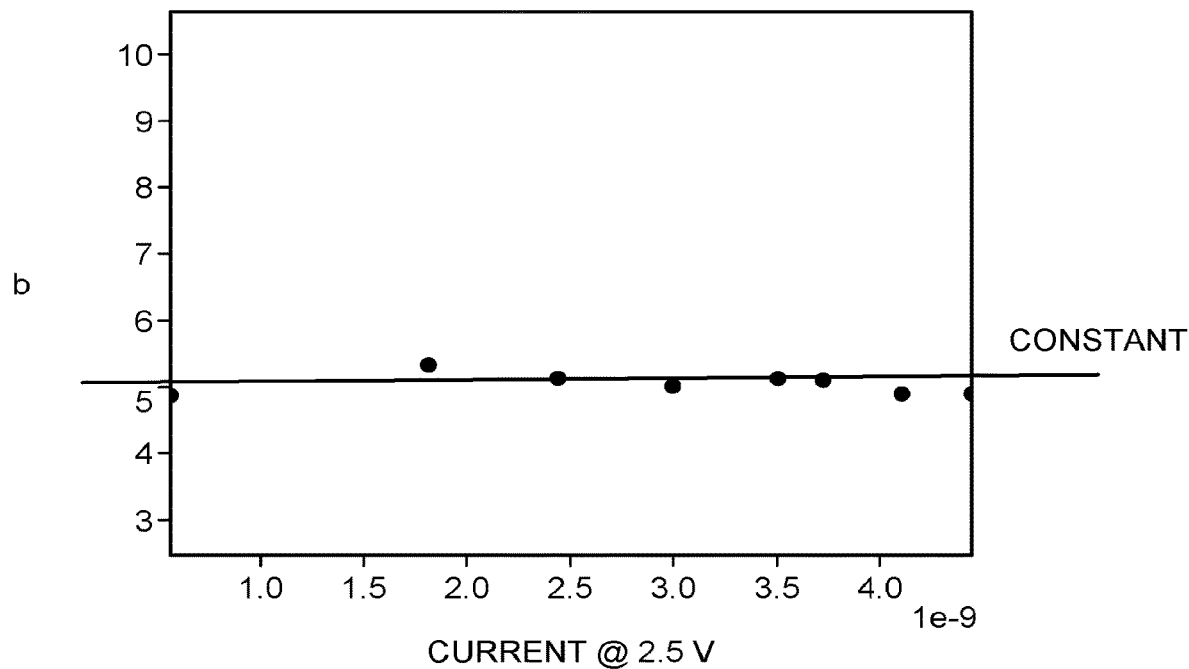
FIG. 11 is a graph illustrating the electrical device parameters of the actually measured FTJ device.

FIG. 11 is a graph illustrating the device parameter b for current flowing in the FTJ device, when the voltage calculated based on the voltage-current characteristics of the actually measured FTJ device is applied at a fixed voltage of 2.5 to the FTJ device. As illustrated in FIG. 11, the device parameter b that is obtained by measuring the FTJ device is mostly constant relative to the current when the voltage applied to the FTJ device is fixed at $V_{READ}$ (2.5 volts). Therefore, by applying an input voltage corrected by an inverse function of the fitted natural exponential function as the voltage to the FTJ device, the current from the FTJ device is largely linear relative to the input voltage.

First Embodiment

The first embodiment is described next.

Figure 12:
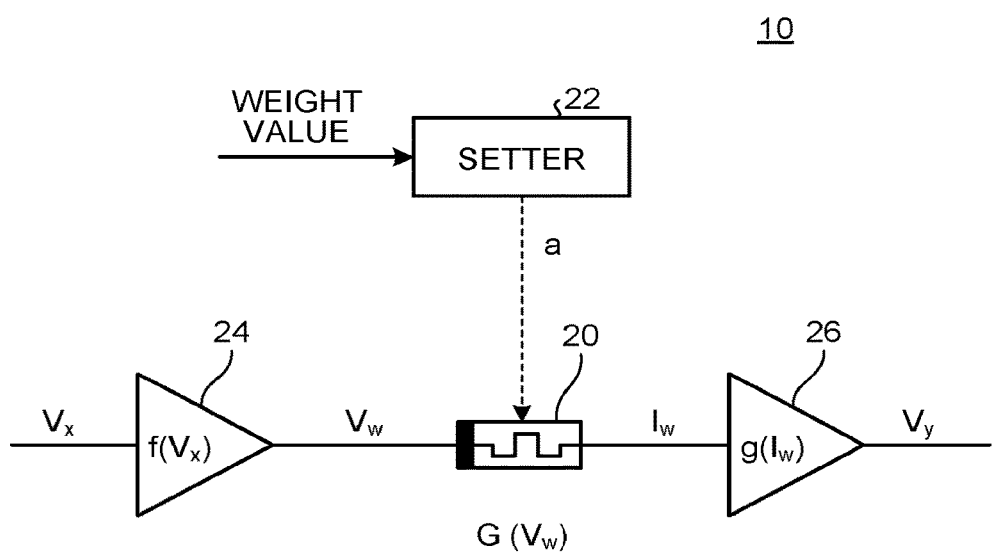
FIG. 12 is a diagram illustrating an arithmetic apparatus according to a first embodiment.

FIG. 12 is a diagram illustrating the structure of an arithmetic apparatus 10 of the first embodiment. The arithmetic apparatus 10 of the first embodiment outputs a multiplication value obtained by multiplying the weight value by the input value. The weight value and the input value and the multiplication (product) value are an analog value (continuous value) of zero or larger. Either or both of the weight value and input value may also be a binary value.

The arithmetic apparatus 10 includes the memristor 20, a setter 22, a logarithmic transform circuit 24, and the current-voltage converter circuit 26.

The voltage-current characteristics of the memristor 20 are measured in the read voltage range during design, and during manufacture and calibration, etc. The voltage-current characteristics of the memristor 20 are also measured when each of a plurality of states is changed.

The memristor 20 then extracts the conductance parameter a and device parameter b by way of the natural exponential function fitted to the voltage-current characteristics in the fitting region. The memristor 20 also calculates a function expressing the conductance parameter a illustrated in formula (3) based on the conductance parameter a in each of the states in which the voltage-current characteristics are changed.

The setter 22 sets the voltage-current characteristics according to the weight value in the memristor 20 prior to the arithmetic operation. Specifically, the setter 22 obtains the weight value from an external device and calculates the conductance parameter a according to the obtained weight value. The setter 22 calculates the conductance parameter a based on the corresponding information expressing the correspondence between the weight value and conductance parameter a. The corresponding information is for example generated based on a function expressing the conductance parameter a that is extracted in the fitting process. The corresponding information may for example be a table or may be a formula expressing the relation between the weight value and the conductance parameter a.

The setter 22 then changes the voltage-current characteristics in the memristor 20 according to the calculated conductance parameter a. The setter 22 for example applies a number of write pulses that correspond to the conductance parameter a to the memristor 20 after applying a predetermined reset voltage to the memristor 20. The setter 22 can in this way set the voltage-current characteristics according to the weight value in the memristor 20.

The logarithmic transform circuit 24 obtains the input voltage according to the input value. The corresponding relation between the input value and the input voltage is established beforehand. The logarithmic transform circuit 24 generates an intermediate voltage by logarithmically transforming the input voltage according to the input value in accordance with a logarithmic transform function obtained by multiplying a natural logarithm function by a preset coefficient.

A logarithm function is set in the logarithmic transform circuit 24 during design, and during manufacture and calibration, etc. The logarithmic transform circuit 24 is implemented for example by an analog circuit including a resistive device, a diode device, an operational amplifier and an inverting amplifier, etc.

Within the logarithmic transform function, the coefficient multiplied by the natural logarithm function is a part of the natural exponential function that is fitted to the voltage-current characteristics of the fitting region as a part of the high voltage side of the read voltage range of the memristor 20. The value of the coefficient is based on the device parameter b multiplied by the variable expressing the voltage. Specifically, the coefficient is the reciprocal of the device parameter b.

The logarithmic transform function is therefore expressed in formula (11).

$$V_w = f(V_x) = \frac{1}{b}\ln(\bullet) \quad (11)$$

Here, the dot within the parentheses of the ln function in formula (11) expresses the variable. The variable within the ln function in formula (11) may be a value dependent on an input value. The input voltage $V_x$ is a voltage dependent on the input value. The input voltage $V_x$ may for example be a voltage converted by a linear function of the input value. Accordingly, if the input voltage is set as $V_x$, the intermediate voltage is set as $V_w$, the coefficient is set as (1/b), and k is a constant, and c is a constant, the logarithmic transform function is expressed by formula (12).

$$V_w = f(V_x) = \frac{1}{b}\ln(kV_x + c) \quad (12)$$

In the present embodiment, the logarithmic transform circuit 24 generates an intermediate voltage by logarithmically transforming the input voltage according to the input value in accordance with a logarithmic transform function expressed in formula (13) with c set as 0.

$$V_w = f(V_x) = \frac{1}{b}\ln(kV_x) \quad (13)$$

The logarithmic transform circuit 24 then applies the generated intermediate voltage to the memristor 20. When the intermediate voltage is applied, the memristor 20 current flow is the current specified by the applied intermediate voltage and the voltage-current characteristics that are set according to the conductance parameter a. The intermediate voltage is lower than the memristor 20 threshold voltage. There is therefore no change in the voltage-current characteristics of the memristor 20 when the intermediate voltage generated by the logarithmic transform circuit 24 is applied.

The current-voltage converter circuit 26 receives the current of the memristor 20 according to the intermediate voltage that is applied. The current-voltage converter circuit 26 generates an output voltage by performing current-voltage conversion of the current flowing in the memristor 20 according to the preset linear function. A linear function is set in the current-voltage converter circuit 26 during design, and during manufacture or calibration, etc. The current-voltage converter circuit 26 is implemented by an analog circuit including for example a resistive device, an operational amplifier and an inverting amplifier, etc.

When the output voltage is set as $V_y$, and a preset constant is set as $R_y$, the linear function (g ($I_w$)) is expressed by formula (14).

$$V_y = g(I_w) = R_y I_w \quad (14)$$

The current-voltage converter circuit 26 outputs the generated output voltage as a multiplicative value obtained by multiplying the weight value by the input value. The corresponding relation between the multiplicative value and the output voltage is set beforehand.

Here, the function expressing the voltage-current characteristics of the memristor 20 is expressed as G ($V_w$). In the present embodiment, the current-voltage characteristics of the memristor 20 approximate the natural exponential function ($I=ae^{bV}$) including the preset conductance parameter a and the device parameter b. The current ($I_w$) flowing in the memristor 20 is therefore expressed by the formula (15).

$$I_w = G(V) = ae^{bV_w} \quad (15)$$

Summarizing formula (13) and formula (15) expresses the current ($I_w$) flowing in the memristor 20 expressed in formula (16)

$$I_w = ae^{bf(kV_w)} = ae^{b(\frac{1}{b}\ln(kV_x))} = akV_x \quad (16)$$

Then, substituting formula (16) into formula (14) expresses the output voltage ($V_y$) as given in formula (17).

$$V_y = R_y akV_x \quad (17)$$

As illustrated above, the arithmetic apparatus 10 of the first embodiment can output an output voltage ($V_y$) by multiplying the conductance parameter a, the input voltage ($V_x$), $R_y$, and k. The conductance parameter a is a value set according to the weight value. The corresponding relation between the input voltage ($V_x$) and input value is established beforehand. The $R_y$ and k are preset constants. The corresponding relation between the output voltage ($V_y$) and the output value is established beforehand. The arithmetic apparatus 10 of the first embodiment can therefore output a multiplicative value obtained by multiplying the weight value by the input value.

Figure 13:
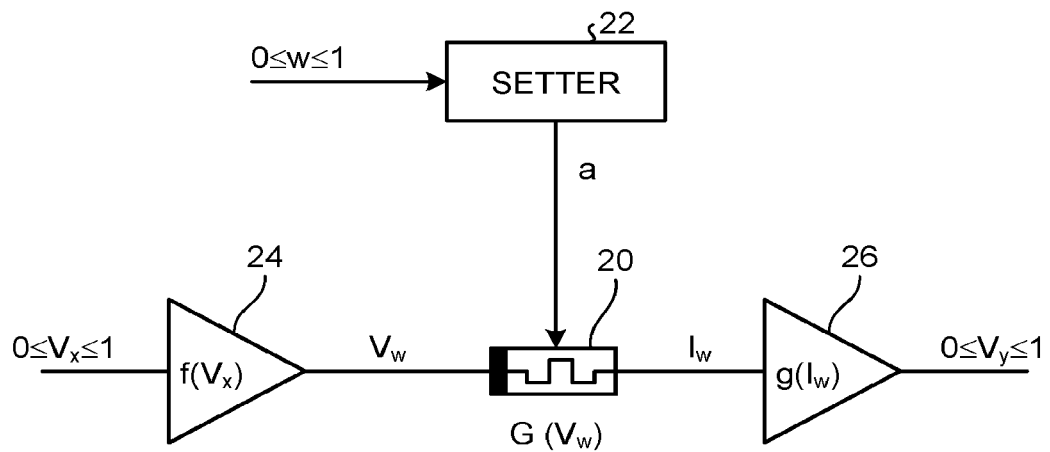
FIG. 13 is a diagram of the arithmetic apparatus for performing normalized multiplication.

FIG. 13 is a diagram of the arithmetic apparatus 10 for performing normalized multiplication. An example of setting the arithmetic apparatus 10 is described for the case when the weight value is 0 to 1, the input voltage is 0 volts to 1 volt, and the output voltage is 0 volts to 1 volt.

The input voltage and output voltage may be a binary value of 0 volts or 1 volt. The weight value may be a binary value of 0 volts or 1 volt. The weight value may also be −1 or +1; or may be L logic or H logic value, etc. When the weight value is a binary value, and there is no 0 or 1, the setter 22 may substitute a 0 into one value and a 1 into the other value.

The setter 22 calculates the conductance parameter a according to the formula (21) when it receives a weight value.

$$a = w \times s \times I_{READ\_1} \quad (21)$$

In the formula, w denotes the weight value, and s is the constant expressed in formula (3). In other words, s is extracted to fit the natural exponential function to the current-voltage characteristics in the fitting region for the memristor 20. The $I_{READ\_1}$ is the maximum current flowing to the memristor 20, and flows when 1 volt is output as the output voltage ($V_y$) when the current is normalized.

The internal parameters of the logarithmic transform circuit 24 are set so as to output $V_{max\_1}$ as expressed in formula (22) when an input voltage ($V_{x\_1}$) of 1 volt is received.

$$\frac{1}{b}\ln(kV_{x\_1}) = V_{max\_1} \quad (22)$$

The $V_{max\_1}$ is the maximum intermediate voltage that is applied to the memristor 20. The $V_{max\_1}$ is included within the read voltage range. The $V_{x\_1}$ expresses 1-volt input voltage. The k is expressed in the following formula (23) when this type of $V_{max\_1}$ is set.

$$k = \frac{e^{bV_{max\_1}}}{V_{x\_1}} = e^{bV_{max\_1}} \quad (23)$$

Here, $I_w$ and $V_y$ are expressed by formula (24) and formula (25) based on formula (16), formula (17), and formula (23).

$$I_w = akV_x = wsI_{READ\_1}e^{bV_{max\_1}}V_x \quad (24)$$

$$V_y = R_y wsI_{READ\_1}e^{bV_{max\_1}}V_x \quad (25)$$

The $R_y$ is set as in formula (26) during design, and during manufacture and calibration, etc.

$$R_y = \frac{1}{sI_{READ\_1}e^{bV_{max\_1}}} \quad (26)$$

The arithmetic apparatus 10 set in this way can perform the operation as in formula (27).

$$V_y = wV_x \quad (27)$$

Figure 14:
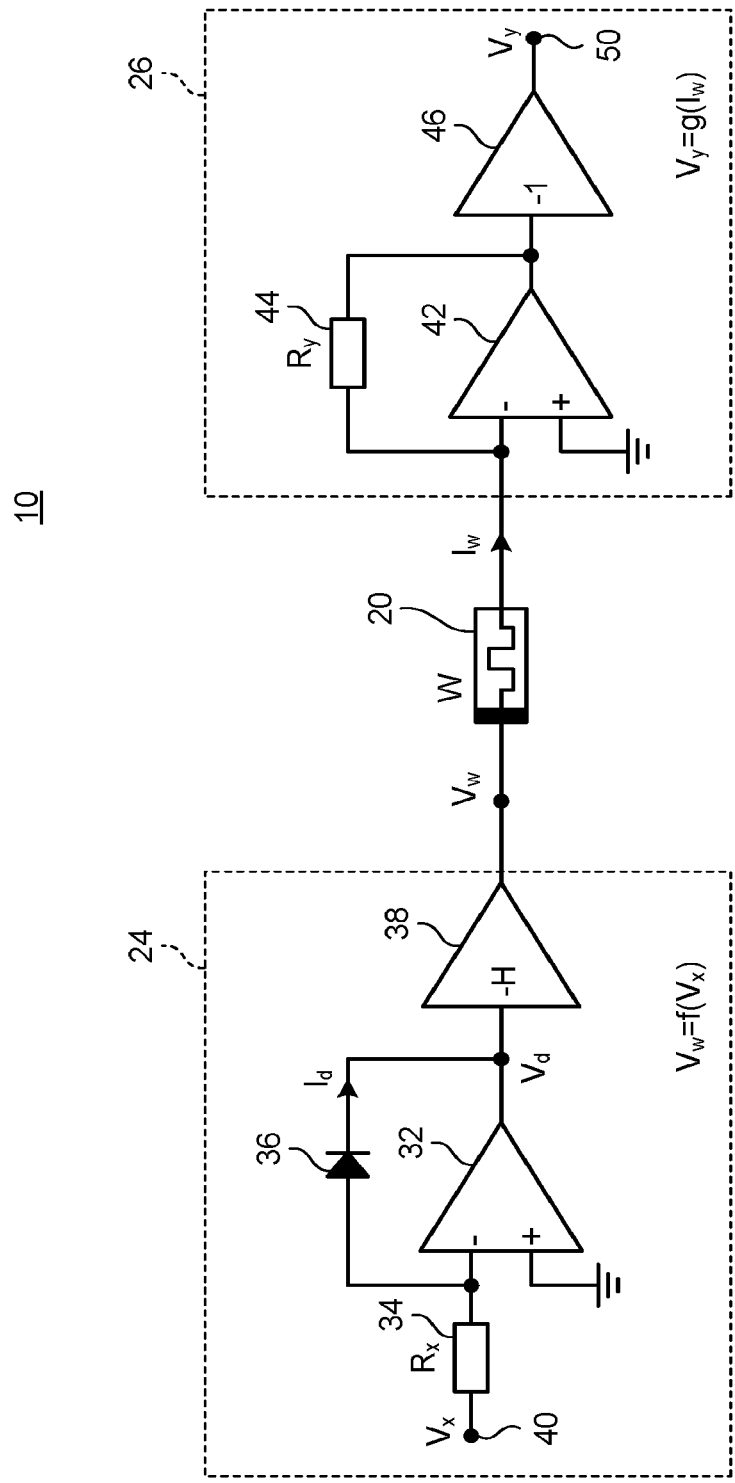
FIG. 14 is a circuit diagram of a logarithmic transform circuit and a current-voltage converter circuit.

FIG. 14 is diagram illustrating an example of circuit configuration of the logarithmic transform circuit 24 and the current-voltage converter circuit 26. The logarithmic transform circuit 24 for example, includes a first operational amplifier 32, an input resistor 34, a diode 36, and a first inverting amplifier circuit 38. The logarithmic transform circuit 24 applies an input voltage ($V_x$) to a voltage input terminal 40.

On the first operational amplifier 32, the non-inverting input terminal is connected to reference potential (e.g., ground). The input resistor 34 is connected between the voltage input terminal 40 and the non-inverting input terminal of the first operational amplifier 32.

The anode of the diode 36 is connected to the non-inverting input terminal of the first operational amplifier 32; and the cathode is connected to the output terminal of the first operational amplifier 32. The first inverting amplifier circuit 38 linearly inverts and amplifies the voltage that is output from the first operational amplifier 32. The first inverting amplifier circuit 38 applies the voltage output from the first operational amplifier 32 as a linearly inverted and amplified voltage to the input terminal of the memristor 20 as an intermediate voltage ($V_w$).

The current-voltage converter circuit 26 includes a second operational amplifier 42, a feedback resistor 44, and a second inverting amplifier circuit 46. On the second operational amplifier 42 the non-inverting input terminal is connected to reference potential (e.g., ground). On the second operational amplifier 42, the output terminal on the memristor 20 is connected to the inverting input terminal. The feedback resistor 44 is connected between the inverting input terminal of the second operational amplifier 42 and the output terminal of the second operational amplifier 42.

The second inverting amplifier circuit 46 linearly inverts and amplifies the voltage output from the second operational amplifier 42. The second inverting amplifier circuit 46 linearly inverts and amplifies the voltage output from the second operational amplifier 42 and outputs the linearly inverted and amplified voltage as an output voltage ($V_y$) from the voltage output terminal 50.

An equation known as the diode equation is illustrated in formula (31).

$$V_d = -nV_T \ln\left(\frac{I_d}{I_s}\right) \quad (31)$$

In the formula (31), $V_d$ denotes the voltage of the diode 36. Here, n denotes the ideal factor and is a constant that is determined by the type of the diode 36, etc. $I_d$ denotes the current flowing in the diode 36. $V_T$ denotes the thermal voltage. $I_s$ denotes the saturation current.

The current ($I_d$) flowing in the diode 36 is expressed in formula (32) when the resistance value of the input resistor 34 is set to $R_x$.

$$I_d = V_x/R_x \quad (32)$$

The intermediate voltage ($V_w$) is expressed in formula (33) when the amplification factor of the first inverting amplifier circuit 38 is set to (−H).

$$V_w = -HV_d \quad (33)$$

From formula (2), the current ($I_w$) flowing in the memristor 20 is expressed as shown in formula (34).

$$I_w = ae^{bV_w} \quad (34)$$

The output voltage ($V_y$) is expressed in formula (35) when the amplification factor of the second inverting amplifier circuit 46 is set to −1.

$$V_y = R_y I_w \quad (35)$$

The current ($I_w$) flowing in the diode 36 is expressed in formula (36) based on formula (31), formula (32), and formula (34).

$$I_w = ae^{bHnV_T \ln\left(\frac{V_x}{R_x I_s}\right)} \qquad (36)$$

The output voltage ($V_y$) is expressed in formula (37) based on formula (35) and formula (36).

$$V_y = R_y a e^{bHnV_T \ln\left(\frac{V_x}{R_x I_s}\right)} \qquad (37)$$

In the formula, b denotes the device parameter. The H is thereupon set as shown in formula (38) for the first inverting amplifier circuit 38.

$$H = \frac{1}{bnV_T} \qquad (38)$$

The output voltage ($V_y$) is expressed as seen in formula (39) when H in formula (38) is set for the first inverting amplifier circuit 38.

$$V_y = R_y a e^{b\frac{1}{bnV_T}nV_T \ln\left(\frac{V_x}{R_x I_s}\right)} = R_y a \frac{V_x}{R_x I_s} \qquad (39)$$

The current flow ($I_w$) in the diode 36 is expressed as seen in formula (40) when H in formula (38) is set for the first inverting amplifier circuit 38.

$$I_w = aV_x \frac{1}{R_x I_s} \qquad (40)$$

Next, an example of setting the arithmetic apparatus 10 illustrated in FIG. 14 is described for the case that the weight value is 0 to 1, the input voltage is 0 volts to 1 volt, and the output voltage is 0 volts to 1 volt.

The setter 22 calculates the conductance parameter a in accordance with formula (41) when the weight value is obtained. The description for w, s, and $I_{READ\_1}$ is the same as described in formula (21).

$$a = s \times w \times I_{READ\_1} \qquad (41)$$

The internal parameters of the logarithmic transform circuit 24 are set so as to output $V_{max\_1}$ as illustrated in formula (42) when a 1-volt input voltage ($V_{x\_1}$) is received.

$$V_{max\_1} = HnV_T \ln\left(\frac{V_{x\_1}}{R_x I_s}\right) \qquad (42)$$

Here, $V_{max\_1}$ is the maximum intermediate voltage applied to the memristor 20 and is included in the read voltage range. Therefore, the resistance value ($R_x$) of the input resistor 34 is set as in formula (43).

$$R_x = e^{\frac{V_{max\_1}}{HnV_T}} \frac{V_{x\_1}}{I_s} \qquad (43)$$

Here, H is set as shown in formula (38) so the resistance value ($R_x$) of the input resistor 34 is expressed as in formula (44).

$$R_x = e^{bV_{max\_1}} \frac{V_{x\_1}}{I_s} \qquad (44)$$

The output voltage ($V_y$) is expressed in formula (45) based on formula (39) and formula (41).

$$V_y = swI_{READ\_1} V_x \frac{R_y}{R_x I_s} \qquad (45)$$

The resistance value ($R_y$) of the feedback resistor 44 is then set as in formula (46).

$$R_y = \frac{R_x I_s}{sI_{READ\_1}} \qquad (46)$$

Setting the above resistance value ($R_x$) of the input resistor 34 and the resistance value (Ry) of the feedback resistor 44 in this way allows the arithmetic apparatus 10 to perform the multiplication of formula (47).

$$V_y = wV_x \qquad (47)$$

Figures 15, 16:
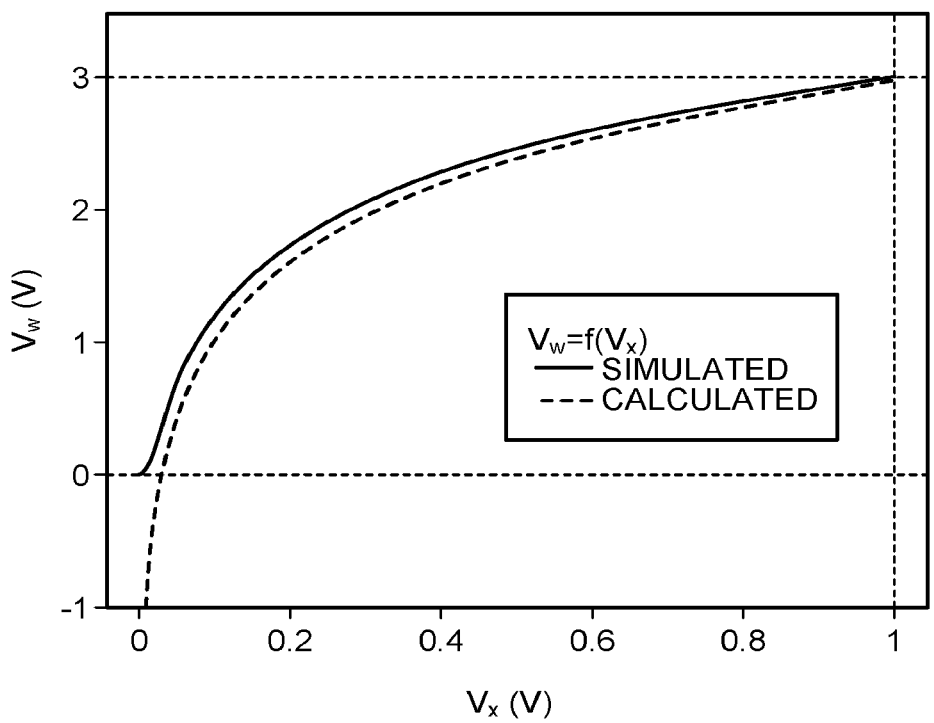
FIG. 15 is a table illustrating an example of parameter setting for the arithmetic apparatus in FIG. 14.
FIG. 16 is a graph illustrating such as results from a simulation of input-output voltage characteristics of the logarithmic transform circuit.
Figure 17:
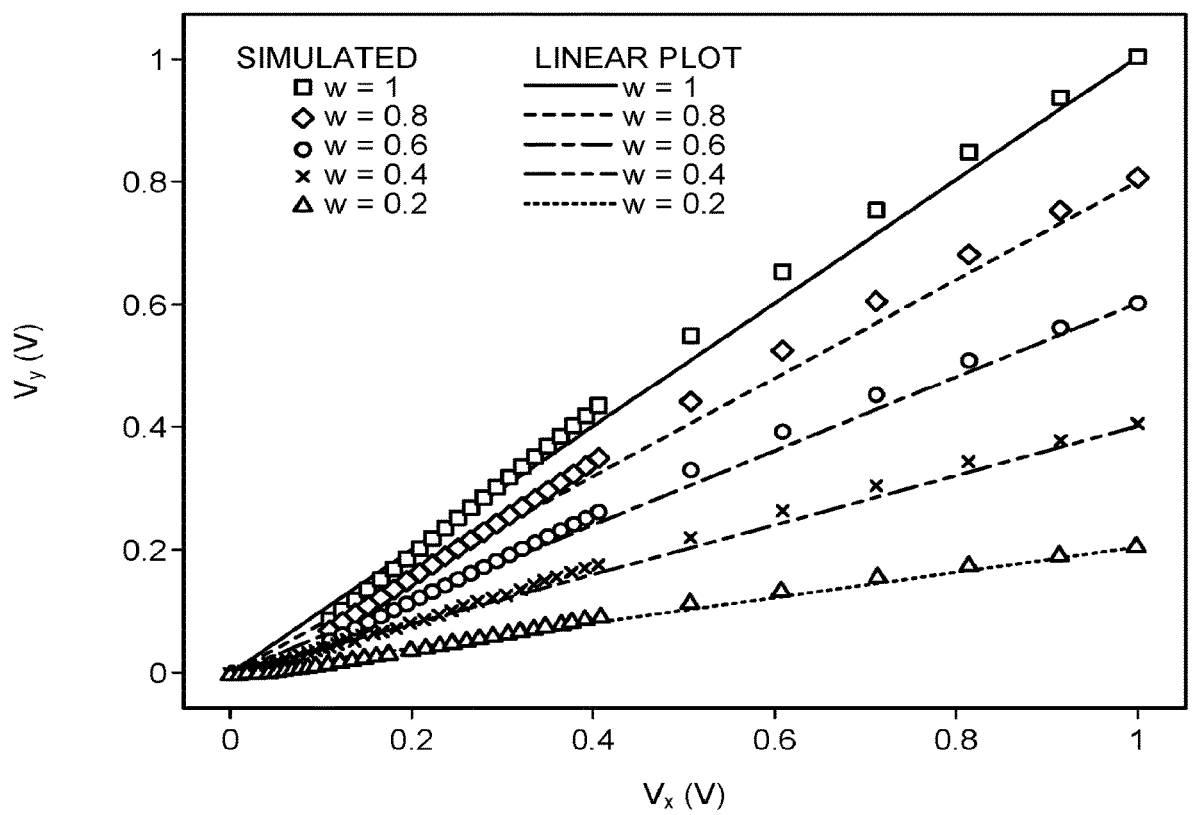
FIG. 17 is a graph illustrating results from a simulation of input-output voltage characteristics of the arithmetic apparatus.

FIG. 15 is a table illustrating an example of setting the parameters for the arithmetic apparatus 10 illustrated in FIG. 14. FIG. 16 is a graph illustrating results of a simulation by a circuit simulator of the input-output voltage characteristics of the logarithmic transform circuit 24 illustrated in FIG. 14 using the parameters set as illustrated in FIG. 15, as well as the results calculated by the arithmetic operation expression. FIG. 17 is a graph illustrating the results of a simulation by a circuit simulator of the input-output voltage characteristics in the arithmetic apparatus 10 illustrated in FIG. 14 using the parameters set as illustrated in FIG. 15.

The inventors performed a simulation of the characteristics of the arithmetic apparatus 10 having the structure illustrated in FIG. 14 using the Simulation Program with Integrated Circuit Emphasis (SPICE) as the circuit simulator. The parameters of device etc. for the arithmetic apparatus 10 with the structure in FIG. 14 are as illustrated in FIG. 15.

As illustrated in FIG. 16, the simulation results of the input-output voltage characteristics (the intermediate voltage ($V_w$) characteristics relative to input voltage ($V_x$)) of the logarithmic transform circuit 24 are a good match for the results calculated by the arithmetic operation. As illustrated in FIG. 17, simulation results of the input-output characteristics of the arithmetic apparatus 10 (the output voltage ($V_y$) characteristics relative to input voltage ($V_x$)) are nearly linear. The simulation results of the characteristics for the arithmetic apparatus 10 were also nearly linear when the weight value (w) is changed.

Therefore, as described above, the arithmetic apparatus 10 of the present embodiment is capable of performing multiplication with good accuracy. The arithmetic apparatus 10 of the present embodiment is also capable of performing multiplication with low power consumption by utilizing the memristor 20.

Second Embodiment

The second embodiment is described next. A multiply-accumulate unit 60 of the second embodiment has elements identical to the arithmetic apparatus 10 of the first embodiment. In the description of the multiply-accumulate unit 60, the components identical to the arithmetic apparatus 10 of the first embodiment are assigned the same reference numerals and in-depth descriptions of common points are omitted.

Figure 18:
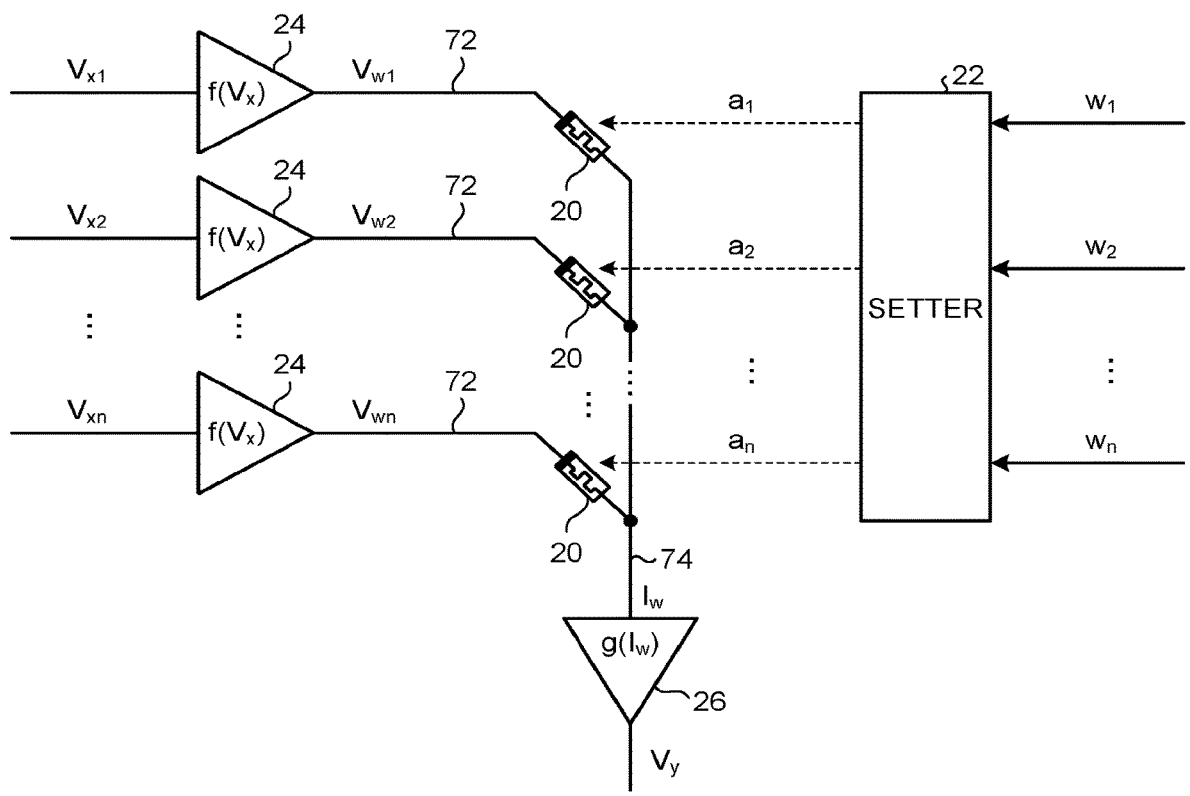
FIG. 18 is a diagram illustrating a multiply-accumulate unit according to a second embodiment.

FIG. 18 is a diagram illustrating a structure of the multiply-accumulate unit 60 of the second embodiment. The multiply-accumulate unit 60 outputs the multiply-accumulate operation value from multiplying and accumulating a plurality of weight values and a plurality of input values. The multiply-accumulate unit 60 for example outputs the multiply-accumulate operation value from multiplying and accumulating n (n is an integer of 2 or more) weight values and n input values.

The multiply-accumulate unit 60 includes a plurality of the memristors 20, a setter 22, a plurality of logarithmic transform circuits 24, and a current-voltage converter circuit 26.

The memristors 20 have the same characteristics. A function expressing the conductance parameter a expressed in formula (3) and the device parameter b are extracted from the memristors 20 during design, and during manufacture or calibration, etc.

The memristors 20 are installed corresponding to the weight values. The multiply-accumulate unit 60 for example includes n memristors 20 that are provided to correspond one-to-one to n weight values. Each of the memristors 20 is preset to a voltage-current characteristic matching the corresponding weight value among the weight values.

The setter 22 sets a voltage-current characteristic according to the weight value for the respective memristors 20 prior to the operation.

The logarithmic transform circuits 24 are installed according to the input values. For example, the multiply-accumulate unit 60 includes n logarithmic transform circuits 24 that are provided to correspond one-to-one to n input values.

Each of the logarithmic transform circuits 24 receives an input voltage according to the corresponding input value. Each of the logarithmic transform circuits 24 generates an intermediate voltage by logarithmically transforming the input voltage according to the corresponding input value among the input values in accordance with a logarithmic transform function obtained by multiplying a natural logarithm function by a preset coefficient. Each of the logarithmic transform circuits 24 applies the generated intermediate voltage to one corresponding memristor 20 among the memristors 20. When the intermediate voltage is applied, each of the memristors 20 provides a current flow designated by the voltage-current characteristics set according to the conductance parameter a and the applied intermediate voltage.

The current-voltage converter circuit 26 receives the current flow according to the intermediate voltage applied from all of the memristors 20. The current-voltage converter circuit 26 generates an output voltage from current-voltage conversion of the total current that is obtained by accumulating the currents flowing through the memristors 20 according to a preset linear function. The current-voltage converter circuit 26 outputs the generated output voltage as a multiple-accumulate operation value obtained by a multiply-accumulate operation of the weight values and the input values. The corresponding relation between the multiple-accumulate operation value and the output voltage is set beforehand.

The multiply-accumulate unit 60 set in this way can perform the arithmetic operation as illustrated in the formula (61) when performing the multiply-accumulate operation of the n weight values and the n input values.

$$V_y = R_y \times k \times (a_1 \times V_{x1} + a_2 \times V_{x2} + \ldots + a_n \times V_{xn}) \quad (61)$$

$V_{x1}$ denotes the input voltage corresponding to the first input value. $V_{x2}$ denotes the input voltage corresponding to the second input value. $V_{xn}$ denotes the input voltage corresponding to the nth input value.

$a_1$ denotes the conductance parameter corresponding to the first weight value ($w_1$). $a_2$ denotes the conductance parameter corresponding to the second weight value ($w_2$). $a_n$ denotes the conductance parameter corresponding to the nth weight value ($w_n$).

The multiply-accumulate unit 60 receives a weight value from 0 to 1, receives an input voltage from 0 volts to 1 volt, and may output an output voltage from 0 volts to 1 volt. In this case, the k and $R_y$ are set in the same way as the first embodiment during the design, and during the manufacture or calibration, etc. The setter 22 calculates the n conductance parameters a in the same way as the first embodiment when the setter 22 receives n weight values.

When set in this way, the multiply-accumulate unit 60 can perform the arithmetic operation that is illustrated in the formula (62).

$$V_y = w_1 \times V_{x1} + w_2 \times V_{x2} + \ldots + w_n \times V_{xn} \quad (62)$$

The multiply-accumulate unit 60 of the second embodiment as described above can output a multiply-accumulate operation value proportionate to the output voltage multiplying and accumulating the weight values and the input values. The multiply-accumulate unit 60 of the present embodiment can perform the multiply-accumulate operation with good accuracy. The multiply-accumulate unit 60 of the present embodiment utilizes the memristors 20 and can therefore perform multiply-accumulate operations with low power consumption.

Third Embodiment

The third embodiment is described next. A matrix operation unit 70 of the third embodiment includes the structural elements identical to the arithmetic apparatus 10 of the first embodiment and the multiply-accumulate unit 60 of the second embodiment. In the description of the matrix operation unit 70, the structural elements identical to the arithmetic apparatus 10 of the first embodiment and the multiply-accumulate unit 60 of the second embodiment are assigned the same reference numerals and in-depth descriptions of common points are omitted.

Figure 19:
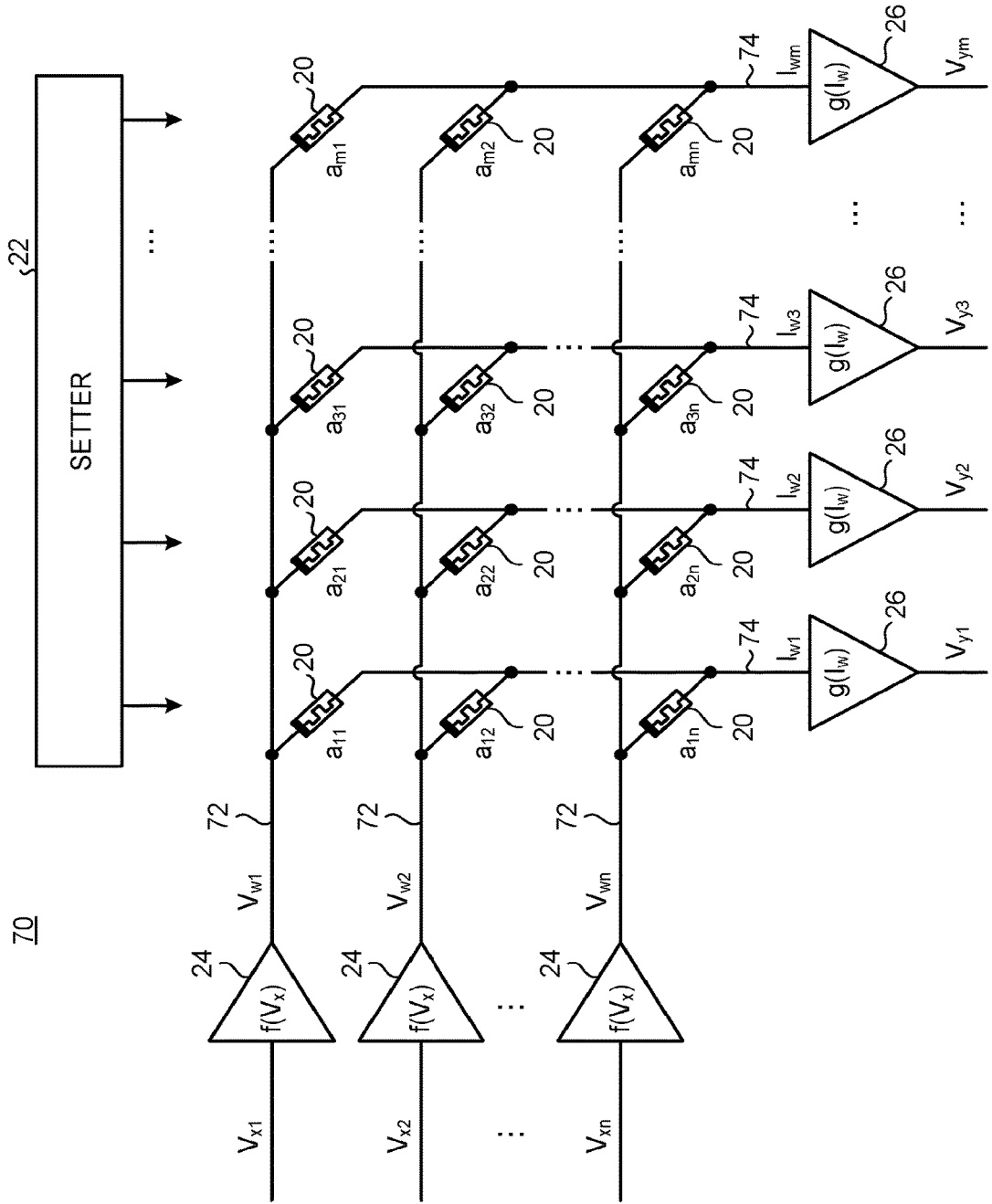
FIG. 19 is a diagram illustrating a matrix operation unit according to a third embodiment.

FIG. 19 is a diagram illustrating the structure of the matrix operation unit 70 of the third embodiment. The matrix operation unit 70 outputs m output values by performing a matrix arithmetic operation on m×n weight values arranged in matrix of m row (m is one or more integers)×n columns (n is one or more integers), and n input values.

The matrix operation unit 70 includes n column-lines 72, m row-lines 74, the m×n memristors 20, the setter 22, n logarithmic transform circuits 24, and m current-voltage converter circuits 26.

The n column-lines 72 are positioned one for each n column. The m row-lines 74 are positioned one for each m row.

The m×n memristors 20 have the same characteristics. A function expressing the conductance parameter a and the device parameter b illustrated in formula (3) is extracted for the m×n memristors 20 during the design, and during the manufacture or calibration, etc.

The m×n memristors 20 are arrayed corresponding to the m rows×n columns. In other words, the m×n memristors 20 are provided to correspond one-to-one to the m×n weight values. Each of the m×n memristors 20 is set beforehand to a voltage-current characteristic according to a weight value on the corresponding matrix position among the m×n weight values.

The input terminal on each of the m×n memristors 20 is connected to the column-line 72 on the corresponding column among the n column-lines 72. The output terminal on each of the m×n memristors 20 is connected to the row-line 74 on the corresponding row among the m row-line 74.

The setter 22 sets the voltage-current characteristics according to the weight value on the corresponding matrix position among the m×n weight values for each of the m×n memristors 20 prior to the operation.

The n logarithmic transform circuits 24 are arrayed corresponding to the n column. The n logarithmic transform circuits 24 are installed to correspond one-to-one to the n input values. Each of the n logarithmic transform circuits 24 receives an input voltage according to the corresponding input value among the n input values. Each of the n logarithmic transform circuits 24 generates an intermediate voltage by logarithmically transforming the input voltage according to the input value in accordance with a logarithmic transform function obtained by multiplying a natural logarithm function by a preset coefficient.

Each of the n logarithmic transform circuits 24 applies the generated intermediate voltage to the column-line 72 on the corresponding column among the n column-lines 72. In this way, each of the n logarithmic transform circuits 24 can apply an intermediate voltage to the m memristors 20 that is connected to the corresponding column-line 72. Each of the m memristors 20 receiving the applied intermediate voltage provides a current flow designated by the voltage-current characteristics set according to the applied intermediate voltage and the conductance parameter a.

The m current-voltage converter circuits 26 are arrayed corresponding to the m row. The m current-voltage converter circuits 26 are installed to correspond one-to-one to the m output values.

Each of the m current-voltage converter circuits 26 receives the total current flowing in the n memristors 20 connected to the corresponding row-line 74 among the m row-lines 74. Each of the m current-voltage converter circuits 26 generates an output voltage obtained by voltage-current conversion of the total current according to the linear function set beforehand. Each of the m current-voltage converter circuits 26 outputs the generated output voltage as a corresponding output value among the m output values.

The m current-voltage converter circuits 26 also outputs the generated m output voltage as m output values obtained by a matrix arithmetic operation on the m×n weight values and the n input values. The corresponding relation between the output value and the output voltage is set beforehand.

The above described matrix operation unit 70 can perform arithmetic operations as expressed in formula (71).

$$\begin{pmatrix} V_{y1} \\ V_{y2} \\ V_{y3} \\ \vdots \\ V_{ym} \end{pmatrix} = R_y k \begin{pmatrix} a_{11} & a_{12} & \cdots & a_{1n} \\ a_{21} & a_{22} & \cdots & a_{2n} \\ a_{31} & a_{32} & \cdots & a_{3n} \\ \vdots & \vdots & \ddots & \vdots \\ a_{m1} & a_{m2} & \cdots & a_{mn} \end{pmatrix} \begin{pmatrix} V_{x1} \\ V_{x2} \\ \vdots \\ V_{xn} \end{pmatrix} \quad (71)$$

Here, $V_{x1}$ denotes the input voltage corresponding to the first input value. $V_{x2}$ denotes the input voltage corresponding to the second input value. $V_{xn}$ denotes the input voltage corresponding to the nth input value.

Here, $V_{y1}$ denotes the output voltage corresponding to the first output value. $V_{y2}$ denotes the output voltage corresponding to the second output value. $V_{ym}$ denotes the output voltage corresponding to the mth output value.

Here, $a_{11}$ denotes the conductance parameter corresponding to the weight value ($w_{11}$) of the matrix position of row 1 column 1. $a_{mn}$ denotes the conductance parameter corresponding to the weight value ($w_{mn}$) of the matrix position of row m column n.

The matrix operation unit 70 receives a weight value from 0 to 1, receives an input voltage of 0 volts to 1 volt, and may output an output voltage from 0 volts to 1 volt. In this case, the k and $R_y$ are set in the same way as the first embodiment during the design, and during the manufacture or calibration, etc. The setter 22 calculates the m×n conductance parameter in the same way as the first embodiment when receiving m×n weight values.

The above described matrix operation unit 70 can perform arithmetic operations as expressed in formula (72).

$$\begin{pmatrix} V_{y1} \\ V_{y2} \\ V_{y3} \\ \vdots \\ V_{ym} \end{pmatrix} = \begin{pmatrix} w_{11} & w_{12} & \cdots & w_{1n} \\ w_{21} & w_{22} & \cdots & w_{2n} \\ w_{31} & w_{32} & \cdots & w_{3n} \\ \vdots & \vdots & \ddots & \vdots \\ w_{m1} & w_{m2} & \cdots & w_{mn} \end{pmatrix} \begin{pmatrix} V_{x1} \\ V_{x2} \\ \vdots \\ V_{xn} \end{pmatrix} \quad (72)$$

The matrix operation unit 70 of the third embodiment as described above, can output m output values by a matrix operation on m×n weight values and n input values of the matrix position on m rows×n columns. The matrix operation unit 70 of the present embodiment can perform matrix operations with good accuracy. The matrix operation unit 70 utilizes the memristors 20 and can therefore perform matrix operations with low power consumption.

In the matrix operation unit 70 of the third embodiment, the memristor 20 has self-rectifying function and so the current flowing into a memristor 20 does not flow into other memristors 20. Therefore, the matrix operation unit 70 of the third embodiment needs no rectifier circuit or switches and accordingly has a simple structure.

Modification

Figure 20:
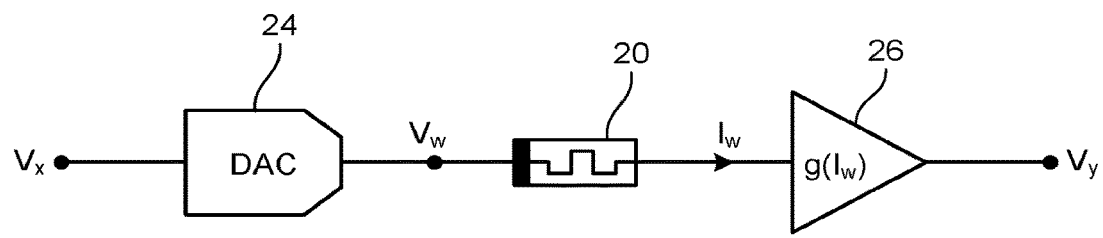
FIG. 20 is a diagram illustrating a logarithmic transform circuit of a modification.

FIG. 20 is a diagram illustrating a modification of the logarithmic transform circuit 24. In the first embodiment, second embodiment, and third embodiment, the logarithmic transform circuit 24 may be implemented by a digital-analog (D-A) converter. In this case, after executing a natural logarithmic operation by the digital operation, the logarithmic transform circuit 24 performs a digital-analog conversion. The logarithmic transform circuit 24 of the modification therefore receives the input value ($V_x$) expressed by a digital value and outputs an intermediate voltage ($V_w$) that is an analog voltage.

Figure 21:
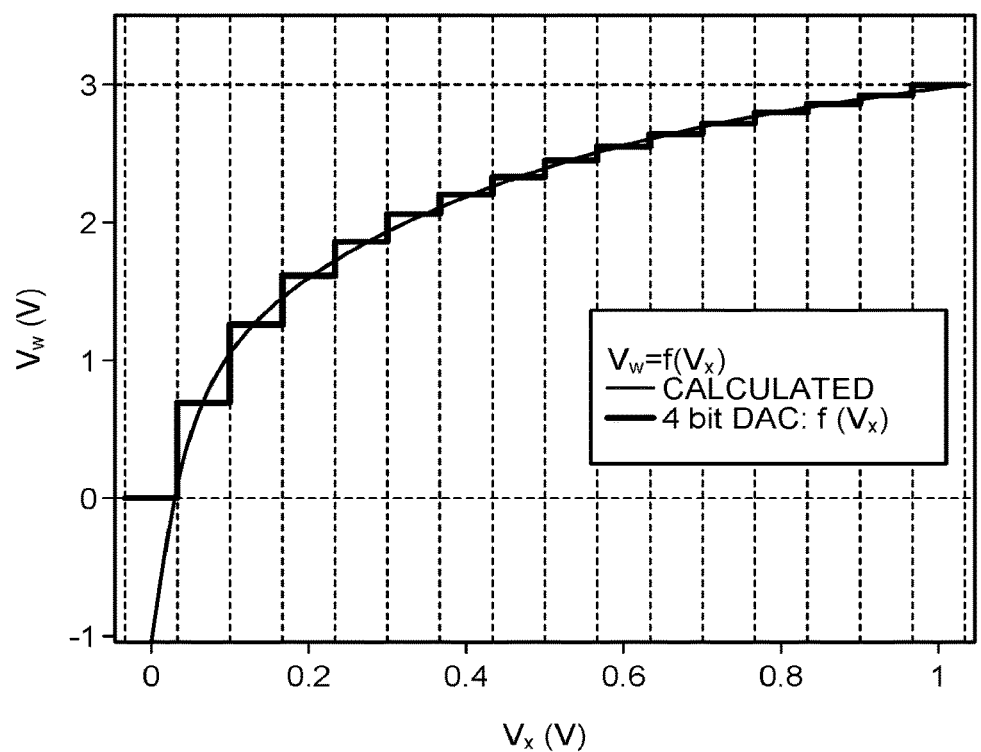
FIG. 21 is a graph of input-output characteristics of the logarithmic transform circuit of the modification.

FIG. 21 is a graph illustrating an example of the input-output characteristics of the logarithmic transform circuit 24 of the modification. The logarithmic transform circuit 24 of the modification generates an intermediate voltage ($V_w$) by digital-analog conversion and so includes quantization errors. However, the logarithmic transform circuit 24 of the modification can perform arithmetic operations with good accuracy by increasing the number of quantization bits for digital-analog conversion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An arithmetic apparatus that outputs a multiplicative value obtained by multiplying a weight value by an input value, the apparatus comprising:
   a memristor as a device that is capable of changing a voltage-current characteristic, and is preset to a voltage-current characteristic according to the weight value;
   a logarithmic transform circuit that applies an intermediate voltage, to the memristor, that is obtained by logarithmically transforming an input voltage according to the input value in accordance with a logarithmic transform function obtained by multiplying a natural logarithm function by a preset coefficient; and
   a current-voltage converter circuit that outputs an output voltage, as a multiplicative value, obtained by performing current-voltage conversion of current flowing through the memristor according to a preset linear function.

2. The arithmetic apparatus according to claim 1, wherein the coefficient is an inverse of a device parameter multiplied by a variable expressing voltage included in a natural exponential function fitted to the voltage-current characteristic in a fitting region that is a partial region on a high voltage side within a read voltage range of the memristor.

3. The arithmetic apparatus according to claim 2, wherein the fitting region is the region where device parameters included in the fitted natural exponential function are constant regardless of a change in the voltage-current characteristic within the read voltage range.

4. The arithmetic apparatus according to claim 2, wherein the memristor is a tunneling device that passes electrical charges or positive holes by way of a tunneling effect.

5. The arithmetic apparatus according to claim 4, wherein the memristor is a ferroelectric tunnel junction device having material including a ferroelectric substance as a tunnel insulator film.

6. The arithmetic apparatus according to claim 2, wherein the memristor changes the current-voltage characteristic when a voltage equal to or higher than a threshold voltage is applied, the memristor does not change the current-voltage characteristic when a voltage lower than the threshold voltage is applied, and the read voltage range is a voltage range lower than the threshold voltage.

7. The arithmetic apparatus according to claim 6, wherein the memristor is preset to a voltage-current characteristic for flowing current corresponding to a value obtained by multiplying the weight value by the predetermined value when a voltage corresponding to a predetermined value is applied.

8. The arithmetic apparatus according to claim 7, wherein when the input voltage is set as $V_x$, the intermediate voltage is set as $V_w$, the coefficient is set as $1/b$, and k is set as a constant, the logarithmic transform function is expressed by $V_w = (1/b) \times \ln(k \times V_x)$,
   when the current through the memristor is set as I, the voltage across the memristor is expressed as V, and when the Euler number is set as e, the natural exponential function is expressed by $I = a \times e^{(b \times v)}$, and
   a conductance parameter a expressing a slope of the voltage-current characteristic in the natural exponential function and the device parameter b are extracted, by fitting the natural exponential function to the voltage-current characteristic in the fitting region.

9. The arithmetic apparatus according to claim 8, further comprising a setter that receives the weight value prior to the arithmetic operation, specifies the conductance parameter corresponding to the weight value based on corresponding information expressing a corresponding relation between the weight value and the conductance parameter, and changes a state of the memristor so as to have a voltage-current characteristic corresponding to the specified conductance parameter.

10. The arithmetic apparatus according to claim 1, wherein the logarithmic transform circuit comprises:
    a first operational amplifier with a non-inverting input terminal that is connected to reference potential;
    an input resistor connected between the input terminal to which the input voltage is applied, and an inverting input terminal of the first operational amplifier;
    a diode with an anode connected to the inverting input terminal of the first operational amplifier, and a cathode connected to an output terminal of the first operational amplifier; and
    a first inverting amplifier circuit that applies the voltage output from the first operational amplifier as a linearly inverted and amplified voltage to the input terminal of the memristor as the intermediate voltage.

11. The arithmetic apparatus according to claim 10, wherein the current-voltage converter circuit comprises:
    a second operational amplifier with a non-inverting input terminal connected to reference potential, and an inverting input terminal connected to the output terminal of the memristor;
    a feedback resistor that is connected between the inverting input terminal of the second operational amplifier and an output terminal of the second operational amplifier; and
    a second inverting amplifier circuit that linearly inverts and amplifies the voltage output from the second operational amplifier, and outputs the linearly inverted and amplified voltage as the output voltage.

12. An arithmetic apparatus that outputs a multiply-accumulate value obtained by multiplying and accumulating a plurality of weight values and a plurality of input values, the apparatus comprising:
    a plurality of memristors provided to correspond to the weight values;
    a plurality of logarithmic transform circuits provided to correspond to the input values; and
    a current-voltage converter circuit, wherein
    each of the memristors is a device that is capable of changing a voltage-current characteristic and is preset to a voltage-current characteristic according to a weight value among the weight values,
    each of the logarithmic transform circuits applies an intermediate voltage that is obtained by logarithmically transforming an input voltage according to a corresponding input value among the input values to a single corresponding memristor among the memristors, in accordance with a logarithmic transform function obtained by multiplying a natural logarithm function by a preset coefficient, and the current-voltage converter circuit outputs an output voltage as a multiply-accumulate value that is obtained by performing current-voltage conversion of total current that is obtained by accumulating currents flowing through the memristors according to a preset linear function.

13. An arithmetic apparatus that outputs m output values by performing a matrix arithmetic operation on m×n weight values arranged in matrix of m rows×n columns, and n input values, m being one or more integers, n being one or more integers, the apparatus comprising:

n column-lines positioned corresponding to n columns;

m row-lines positioned corresponding to m rows;

m×n memristors provided corresponding to the m rows×n columns;

n logarithmic transform circuits that are provided corresponding to n columns; and m current-voltage converter circuits that are provided corresponding to m rows, wherein each of the m×n memristors is a device that is capable of changing a voltage-current characteristic, and is preset to a voltage-current characteristic corresponding to a weight value at a matrix position among the m×n weight values, and an input terminal of the memristor is connected to the column-line on the corresponding column among the n column-lines, and an output terminal of the memristor is connected to the row-line on the corresponding row among the m row-lines, each of the n logarithmic transform circuits applies an intermediate voltage that is obtained by logarithmically transforming an input voltage according to a corresponding input value among n input values, to m memristors connected to a corresponding column-line among the n column lines, in accordance with a logarithmic transform function obtained by multiplying a natural logarithm function by a preset coefficient, and each of the m current-voltage converter circuits outputs an output voltage, as a corresponding output value among the m output values, that is obtained by performing current-voltage conversion of total current flowing through the n memristors connected to a corresponding row line among m row lines, according to a preset linear function.

14. The arithmetic apparatus according to claim 13, wherein each of the m×n memristors causes the current to flow in a forward direction from the input terminal to the output terminal, and has a self-rectifying function that prevents current from flowing in a reverse direction.

* * * * *